United States Patent

Kobayashi

[15] 3,635,709

[45] Jan. 18, 1972

[54] LIGHT-SENSITIVE LITHOGRAPHIC PLATE

[72] Inventor: Kesanao Kobayashi, Kanagawa, Japan

[73] Assignee: Polychrome Corporation, Yonkers, N.Y.

[22] Filed: June 5, 1969

[21] Appl. No.: 833,878

Related U.S. Application Data

[63] Continuation of Ser. No. 601,847, Dec. 15, 1966, abandoned.

[52] U.S. Cl. ....................96/33, 96/91 D, 117/36.1, 260/141

[51] Int. Cl. ....................G03f 7/02, G03c 1/52, C07c 113/00

[58] Field of Search ....................96/75, 43, 33–49, 96/91 D; 200/141–142; 117/36.1

[56] References Cited

UNITED STATES PATENTS

| | | | |
|---|---|---|---|
| 2,767,092 | 10/1956 | Schmidt | 96/91 D |
| 3,046,118 | 7/1962 | Schmidt | 96/91 D |
| 3,046,120 | 7/1962 | Schmidt | 96/91 D |
| 3,106,465 | 10/1963 | Neugebauer et al. | 96/91 D |
| 3,130,047 | 4/1964 | Uhlig et al. | 96/49 X |
| 3,188,210 | 6/1965 | Fritz et al. | 96/49 X |

*Primary Examiner*—Norman G. Torchin
*Assistant Examiner*—Alfonso T. Suro Pico
*Attorney*—Curtis, Morris & Safford

[57] ABSTRACT

Light-sensitive compositions and positive-acting lithographic printing plates made therewith comprising an ester of 2-diazo-1-naphthol-4(or -5)-sulfonic acid with a polyhydroxy-phenyl that is a condensation product of acetone and pyrogallol.

18 Claims, No Drawings

LIGHT-SENSITIVE LITHOGRAPHIC PLATE

This application is a continuation of prior copending application Ser. No. 601,847 filed Dec. 15, 1966, now abandoned.

The present invention relates to a positive lithographic printing plate endowed with light sensitivity by a diazo oxide resin.

Diazonium compounds conventionally known as light-sensitive agents for making light-sensitive lithographic printing plates can be divided into two kinds depending on their specific properties. That is, one kind is a diazonium compound capable of being decomposed by exposure into an oleophilic material and the other kind is a diazonium compound capable of being converted by exposure into an alkali-soluble substance. When a composition containing the former kind of compound is applied on a hydrophilic support and the support is exposed to light through a transparent or translucent negative original, only the exposed portions are rendered hydrophobic and organophilic, that is, water repellent and ink receptive, and the unexposed portions can easily be removed with water or a phosphate solution whereby a positive image can be obtained. Such a system is described in detail in U.S. Pat. No. 2,714,066. On the other hand, when a composition containing the latter kind of compound is dissolved in an organic solvent, applied to a hydrophilic support and after exposure is developed by an alkaline solution, the exposed portions are dissolved out also to provide a positive image. Such a system is described in detail in U.S. Pat. Nos. 3,046,122 and 3,046,123.

The compounds described in the above-mentioned U.S. Pat. specifications are applied to lithographic printing plates as esters or acid amides of benzene or naphthalene diazoxide, and there have hitherto been reported many such compounds. However, almost all of them are low-molecular weight compounds and hence if such a compound is used individually it is deposited in crystalline form which results in lowering the mechanical strength of the image obtained and making long press runs difficult to attain. Accordingly, an alcohol-soluble resin such as a phenol-formaldehyde resin, shellac or styrene-maleic anhydride resin is used as a carrier for the compound to prevent the light-sensitive layer from crystalizing and to compensate for any weakening of the mechanical strength. However, if materials other than a light-sensitive agent are incorporated into the light-sensitive layer there is a tendency to reduce the sharpness of the light-sensitive layer to development. In order to overcome such a difficulty it is disclosed in U.S. Pat. No. 3,046,120 that the light-sensitive agent itself is converted into a high molecular weight compound. However, if an aluminum plate is used as a support, the adhesive property of the compound described in the specification of the above U.S. Pat. with the aluminum plate is low, which results in reducing the mechanical strength of the image, and hence the practical value of such a plate is low.

Therefore, an object of the present invention is to provide a light-sensitive lithographic printing plate containing an improved light-sensitive agent unaccompanied by the above-mentioned drawbacks. Other objects of this invention are to form a coating having sufficient film strength without the necessity of adding other film-forming agents as well as to increase the adhesive property between an aluminum plate and the coating thereon. A further object is to provide a sensitizer capable of being converted to a high molecular state and at the same time having a good film-forming capability.

Broadly, the light-sensitive lithographic plates of this invention contain in the light-sensitive layer at least one of the esters of 2-diazo-1-naphthol-5-sulfonic acid or 2-diazo-1-naphthol-4-sulfonic acid with a polyhydroxy phenyl.

The polyhydroxy phenyl is a polymerization product obtained by the reaction of acetone and pyrogallol at about room temperature in the presence of a catalyst, for example phosphorus oxychloride. While the structure of the polymer has not yet been confirmed, the mechanism for the formation thereof can be assumed to be same as or similar to the mechanism of the formation of bisphenol-A from acetone and phenol. The polymer can be dissolved in ketones, alcohols and the like, has a molecular weight of about 1,000 to 1,800 and, when it is coated on an aluminum plate as a solution in methyl ethyl ketone, forms a lustrous and strong film.

The esterification of the polymer can be conducted by dissolving diazo oxide sulfonic acid chloride and the polyhydroxy phenyl in a solvent such as dioxane or tetrahydrofuran and then adding into the solution an acid acceptor such as an alkali bicarbonate, an alkali carbonate or other weak alkali. The preferable reaction ratio of the acid chloride to the polyhydroxy phenyl is 1:0.6 to 1:2, preferably 1:1 to 1:1.8. The sulfonic acid chloride of diazo oxide can be obtained from diazo oxide sulfonic acid and chlorosulfonic acid by a well-known manner. The sulfonic acid of diazo oxide can be a commercially available one. The diazo oxide resin is applied to a suitable support as a solution in a solvent such as methyl cellosolve, cellosolve, dimethyl formamide, dioxane, methyl ethyl ketone and butyl acetate. The quantity of the coating for the light-sensitive layer is suitable between about 500 to 700 mg./sq. m., but satisfactory printing plates can be obtained when the quantity of the film is about 50 to 3,000 mg./sq. m. As the method of coating are suitably adopted a dip coat system, an air-knife system, a spray system and a reverse roll system. As the support can be used sheets of aluminum, zinc, magnesium, copper, plastic, paper and glass, but aluminum is most suitable.

Prior to use, a metal sheet such as an aluminum plate should be washed and then treated with sodium phosphate, nitric acid or a sulfuric acid-chromic acid mixture followed by water rinsing; or treated with a silicate as described in U.S. Pat. No. 2,714,066; or treated with a zirconate as described in U.S. Pat. No. 2,946,683; or electrolytically grained as described in British Pat. No. 223,994.

The printing plate coated with the diazo oxide resin is put together with a transparent or translucent positive original and exposed in an arc lamp. For example, it is exposed for about 2 minutes in an arc lamp of bout 35 amp. at a distance of about 70 cm. Thereafter when the light-sensitive layer on the aluminum plate is rubbed with a sponge or an absorbent cotton wad impregnated with, for example, an aqueous solution of tri-sodium phosphate, of about 2 percent to 5 percent strength, the exposed portions of the light-sensitive layer are dissolved out to give a positive image. The image thus obtained is strong and has a long-running presslife.

Comparing the phenol formaldehyde resin described in U.S. Pat. No. 3,046,120 with the diazo oxide resin of this invention, it has been found that the latter has a markedly longer presslife. It is not presently clear why there is such a remarkable difference, but it is considered perhaps to be caused by the presence of many unreacted hydroxyl groups in the latter resin. Since the esterification product of the polyhydroxy phenyl with the diazo oxide has an ability to form a film by itself, it can provide printing plates having high fidelity but without the reduction of image quality caused by the presence of foreign materials. However, foreign materials can be added, if desired, in amounts not sufficient to effect adversely the image quality, to provide printing plates which can be used more easily. For example, a coloring agent can be incorporated into the light-sensitive layer to obtain a visible image at development. As a coloring agent suitable for that purpose can be employed a blue organic pigment, such as phthalocyanine blue, or an oil-soluble dye, such as malachite green. Furthermore, in the field of type founding, a so-called repeating printing in which plural originals are printed on one plate has frequently been attempted and in such a case, for adjusting the positions of each originals, a register mark is first printed and after developing, the originals are printed. However, if it is possible to make a so-called printing out image in which by only exposure some change, for example, some change in color hue or color density occurs between the exposed portion and the unexposed portion, whereby a clear difference between them can be observed, the repeating printing will be simplified. For that purpose an azo dye such as p-dimethylamine benzene or p-benzeneazodiphenyl amine is suitable. Moreover, in the case of making an etching plate, such as an intaglio, an alcohol-soluble resin such as a phenol-formaldehyde resin or a styrene-maleic anhydride resin can be incorporated in the light-sensitive layer to increase the resistance to etching solution. In the case of incorporating such a resin in the light-sensitive layer of a lithographic printing plate, the addition of a plasticizer such as dioctyl phthalate, triphenyl phosphate or o-phenyl phenol is effective for improving the film quality of the light-sensitive layer.

The following examples are set forth to illustrate this invention more fully, but are not intended to limit the scope thereof as disclosed herein above.

EXAMPLE 1

An aluminum plate was immersed in an aqueous solution of trisodium phosphate for a sufficient period of time to remove from the surface oils attached thereto at rolling. That is, the surface of the aluminum plate was cleaned by immersing the aluminum plate for 5 minutes in an aqueous 5 to 10 percent trisodium phosphate solution at 70° C. By that treatment etching occurred to some extent which increased the water-receptive property of the aluminum. After water rinsing, the aluminum plate was immersed in an aqueous 70 percent nitric acid solution and after sufficiently rinsing with water, the aluminum plate was immersed for 2 minutes in an aqueous 2 percent potassium zircofluoride solution at 85° C. followed by water rinsing. The aluminum plate thus treated was coated with a solution of 5 parts by weight of a diazo oxide-polyhydroxy phenyl ester resin in 80 parts by weight of cyclohexane under yellow light. The coated amount was about 500 mg./sq. m. and the drying temperature was about 85° C. for about 1 minute. The plate thus prepared had properties suitable for a presensitized plate, and it was used after storage for one year in a dark and cool place; its characteristics were satisfactory. The plate could be exposed under a transparent or translucent positive pattern by a known method, and was exposed for 2 minutes by means of a 35 amp. arc lamp at a distance of 70 cm. Thereafter, the surface of the exposed plate was rubbed with an absorbent cotton wad impregnated with an aqueous solution of trisodium phosphate until the surface was colored purple-brown. It was then water washed and rubbed with a lithographic developing composition, Plano-developing ink No. 801, a trade name of Fuji Photo Film Co. of Japan, by means of a cellulose sponge. Since the exposed portions were dissolved out and a hydrophilic undercoating was exposed, those portions were water receptive. On the other hand the unexposed portions that remained were strongly bonded to the aluminum plate. Those portions had been composed of an oleophilic material from the first and underwent no change during development, and hence they were receptive to greasy ink.

Preparation of polyhydroxyphenyl-2-diazo-1-naphthol-5-sulfonate:

Into 500 g. of dioxane were dissolved 100 g. of 2-diazo-1-naphthol-5-sulfochloride and 62 g. of polyhydroxy phenyl, and then an aqueous 10 percent solution of potassium carbonate was added into the resulting solution slowly with stirring until the solution was completely neutralized while maintaining the solution at 30° C. After finishing the addition, the system was stirred for 30 minutes. After cooling, the solution was added into 2,500 ml. of water in which solids precipitated which were recovered by filtration and dried. The melting point of the product was 250° C.

Preparation of polyhydroxy phenyl:

Into 350 g. of acetone were dissolved 50 g. of pyrogallol. To the solution were then added 5 g. of phosphorus oxychloride as a condensation catalyst, and, after allowing the solution to stand for one night at room temperature, the solution was added dropwise into water with stirring. A tarry resin formed which was dissolved again in a small amount of acetone, and that solution was poured into a large amount of water to precipitate solids, which were recovered by filtration and dried. The melting point of the product was 200°–215° C.

EXAMPLE 2

Both surfaces of an aluminum plate were grained by sand blasting using Alundum of 250-mesh grain size and then immersed in an aqueous 20 percent solution of trisodium phosphate at 70° C. for 1 minute. Thereafter the plate was immersed for 2 minutes in an aqueous 2 percent solution of sodium silicate, in which the ratio of silicic acid to soda was 2.45–2.55:1, at 80°–85° C. Five parts by weight of polyhydroxyphenyl-2-diazo-1-naphthol-4-sulfonate, which had been prepared by the method described in example 1, were ball milled with 2 parts by weight of an oil-soluble phenol resin, 1 part by weight of phthalocyanine blue and 20 parts by weight of methyl ethyl ketone for 18 hours, and the resulting mixture was diluted with 60 parts by weight of methyl ethyl ketone and applied to the processed aluminum plate. The surface of the plate having the coating of the light-sensitive material was lustrous green. Water drops contacting the surface of the plate were repelled and water-drop patterns left on the surface of printing plates after manufacturing, frequently seen on conventional presensitized lithographic printing plates, were not observed. A transparent pattern was placed on the plate and exposed by a known method. For example, the plate was exposed for 2 minutes by means of a 35 m. amp. arc lamp at a distance of 70 cm. Thereafter the exposed surface was rubbed softly with an absorbent cotton wad impregnated with an aqueous 5 percent solution of trisodium phosphate. The image portions were relieved distinctly in green against the background of the milk-white aluminum base.

EXAMPLE 3

Into 70 parts by weight of methyl cellosolve were dissolved 5 parts by weight of polyhydroxyphenyl-2-diazo-1-naphtol-5-sulfonate, which had been prepared by the method described in example 1, 1 part by weight of an oil-soluble phenol resin and 0.8 part by weight of p-phenylazo-diphenylamine, and the resulting solution was applied by a spray coating method onto an aluminum plate having a hydrophilic layer thereon formed by the method described in example 1. The plate was exposed as disclosed in example 1; the exposed portions were colored orange and hence clearly distinguished from the unexposed portions. An aqueous 5 percent solution of trisodium phosphate was sprayed onto the plate to dissolve out the exposed portions and, after water washing, a rubber solution of 7° Be' was applied over the plate in a thin layer.

I claim:

1. A light-sensitive resin which comprises an ester reaction product of 2-diazo-1-naphthol-4-sulfonic acid or 2-diazo-1-naphthol-5-sulfonic acid with a polyhydroxy-phenol condensation product of pyrogallol and acetone.

2. A resin according to claim 1 wherein said polyhydroxy-phenol condensation product is formed in the presence of a polymerization catalyst.

3. A resin according to claim 2 wherein said catalyst is phosphorus oxychloride and the condensation is conducted at about room temperature.

4. A resin according to claim 1 wherein said condensation product has a molecular weight between about 1,000 and about 1,800.

5. A resin according to claim 1 wherein said ester reaction product is based on 2-diazo-1-naphthol-4-sulfonic acid.

6. A resin according to claim 1 wherein said ester reaction product is based on 2-diazo-1-naphthol-5-sulfonic acid.

7. A resin according to claim 1 wherein said sulfonic acid and said condensation product are in a ratio of about 1:0.6 to about 1:2 parts by weight.

8. A light-sensitive positive-acting lithographic printing plate which comprises a support and a coating on said support containing a light-sensitive resin that is an ester reaction product of 2-diazo-1-naphthol-4-sulfonic acid or 2-diazo-1-naphthol-5-sulfonic acid with a polyhydroxy-phenol condensation product of pyrogallol and acetone.

9. A plate according to claim 8 wherein said polyhydroxy-phenol condensation product is formed in the presence of a polymerization catalyst.

10. A plate according to claim 9 wherein said catalyst is phosphorus oxychloride and the condensation is conducted at about room temperature.

11. A plate according to claim 8 wherein said condensation product has a molecular weight between about 1,000 and about 1,800.

12. A plate according to claim 8 wherein said ester reaction product is based on 2-diazo-1-naphthol-4-sulfonic acid.

13. A plate according to claim 8 wherein said ester reaction product is base on 2-diazo-1-naphthol-5-sulfonic acid.

14. A plate according to claim 8 wherein the amount of said coating on said support is from about 50 to about 3,000 mg./sq. m.

15. A plate according to claim 8 wherein the amount of said coating on said support is from about 500 to about 700 mg./sq. m.

16. A plate according to claim 8 wherein said sulfonic acid and said condensation product are in a ratio of about 1:0.6 to about 1:2 parts by weight.

17. A method of making a lithographic printing plate which comprises: coating a support with a film of light-sensitive resin containing an ester reaction product of 2-diazo-1-naphthol-4-sulfonic acid or 2-diazo-1-naphthol-5-sulfonic acid with a polyhydroxy-phenol condensation product of pyrogallol and acetone; exposing the coated support to light through an image transparency; and removing light-exposed portions of said film of resin by preferential dissolution thereof in an aqueous medium.

18. A method according to claim 17 wherein said aqueous medium is a solution of trisodium phosphate in water.

* * * * *